United States Patent
Sasaki et al.

(10) Patent No.: US 9,768,095 B2
(45) Date of Patent: Sep. 19, 2017

(54) SEMICONDUCTOR DEVICE AND MANUFACTURING METHOD THEREOF

(71) Applicants: NIPPON SOKEN, INC., Nishio, Aichi (JP); TOYOTA JIDOSHA KABUSHIKI KAISHA, Toyota-shi, Aichi-ken (JP)

(72) Inventors: Tomo Sasaki, Toyota (JP); Akio Kitami, Toyota (JP); Tadafumi Yoshida, Kasugai (JP); Masataka Deguchi, Nagoya (JP); Kazunori Uchiyama, Okazaki (JP); Naoki Hakamada, Anjo (JP)

(73) Assignees: NIPPON SOKEN, INC., Nishio, Aichi (JP); TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 15/361,151

(22) Filed: Nov. 25, 2016

(65) Prior Publication Data
US 2017/0154837 A1 Jun. 1, 2017

(30) Foreign Application Priority Data
Nov. 26, 2015 (JP) ................. 2015-230249

(51) Int. Cl.
*H01L 23/373* (2006.01)
*H01L 23/42* (2006.01)
*H01L 23/473* (2006.01)

(52) U.S. Cl.
CPC .......... *H01L 23/3736* (2013.01); *H01L 23/42* (2013.01); *H01L 23/473* (2013.01)

(58) Field of Classification Search
CPC .... H01L 23/3736; H01L 23/42; H01L 23/473
See application file for complete search history.

(56) References Cited

U.S. PATENT DOCUMENTS

| 9,299,635 B2 * | 3/2016 | Lee | ................. H01L 23/42 |
| 2004/0042178 A1 * | 3/2004 | Gektin | .............. H01L 23/42 |
| | | | 361/705 |

(Continued)

FOREIGN PATENT DOCUMENTS

| JP | 2001-267475 A | 9/2001 |
| JP | 2007-173372 A | 7/2007 |
| JP | 2017-17229 A | 1/2017 |

*Primary Examiner* — Errol Fernandes
(74) *Attorney, Agent, or Firm* — Sughrue Mion, PLLC

(57) ABSTRACT

A semiconductor device includes a semiconductor module. The semiconductor module includes a package made of resin. The package contains a semiconductor element and a heat sink. The heat sink has a thermal conductive surface exposed on a part of one surface of the package. The semiconductor device includes an insulating plate, which is a part of a cooler, facing the thermal conductive surface of the heat sink and a resin surface around the thermal conductive surface, and pressed against the semiconductor module. At least a part of the thermal conductive surface comprises a recessed region recessed with respect to the resin surface. A solid heat transfer layer is interposed between the recessed region of the thermal conductive surface and the insulating plate, and is not interposed between the resin surface and the insulating plate.

10 Claims, 8 Drawing Sheets

(56) References Cited

U.S. PATENT DOCUMENTS

| | | | |
|---|---|---|---|
| 2005/0116335 A1* | 6/2005 | Karim | H01L 23/4334 257/718 |
| 2006/0118969 A1* | 6/2006 | Yuan | H01L 23/16 257/778 |
| 2009/0109626 A1* | 4/2009 | Sinha | H01L 23/367 361/704 |

* cited by examiner

SEMICONDUCTOR DEVICE AND MANUFACTURING METHOD THEREOF

TECHNICAL FIELD

The present disclosure relates to a semiconductor device in which a semiconductor module is pressed against a cooler and a manufacturing method of the semiconductor device.

BACKGROUND ART

A semiconductor device in which a cooler is pressed against a surface of a semiconductor module containing a semiconductor element is known. Some examples of this type of semiconductor device are disclosed in Japanese Patent Application Publication No. 2007-173372 and Japanese Patent Application Publication No. 2001-267475. In semiconductor modules disclosed in the aforementioned documents, a heat sink is exposed on a part of one surface of a resin package containing a semiconductor element. The exposed surface of the heat sink serves as a thermal conductive surface. The cooler is pressed against the semiconductor module while the cooler faces the thermal conductive surface of the heat sink and a resin surface around the thermal conductive surface. In the semiconductor device disclosed in Japanese Patent Application Publication No. 2007-173372, grease (non-solid heat transfer material) is filled between the semiconductor module and the cooler. The grease enters into between fine irregularities on a surface of the cooler and also enters into between fine irregularities on the thermal conductive surface of the heat sink, which results in a rise in thermal conductivity from the heat sink to the cooler. The grease layer is spread thin by pressing the cooler on the semiconductor module.

A temperature of the heat sink repeatedly rises and falls according to a heat cycle of the semiconductor element. When the heat sink thermally expands, the thermal conductive surface of the heat sink deforms such that a center of the thermal conductive surface of the heat sink is swollen. Accordingly, the grease is pushed out onto the resin surface around the thermal conductive surface of the heat sink. Once the heat sink cools down, the thermal conductive surface is recovered to a flat state. However, part of the grease may not return to its original position. That is, the grease may sometimes flow out from a portion between the thermal conductive surface of the heat sink and the cooler to its surrounding portion over the course of the semiconductor element repeating the heat cycle. Notably, for explanation convenience, a phenomenon where grease flows out from between the thermal conductive surface of a heat sink and a cooler to its surrounding portion will be hereinafter referred to as "grease dissipation".

Meanwhile, the semiconductor device of Japanese Patent Application Publication No. 2001-267475 includes a solid heat transfer layer between a thermal conductive surface of a heat sink and a cooler. Since the solid heat transfer layer does not have fluidity, the aforementioned grease dissipation may not occur. Notably, in the semiconductor device of Japanese Patent Application Publication No. 2001-267475, a part of the heat sink protrudes from a resin surface around the heat sink, and the heat transfer layer is interposed between the cooler and a top surface of the protruding portion of the heat sink. Since the part of the heat sink protrudes from the resin surface, the resin surface is set apart from the cooler and the heat transfer layer is not provided between the resin surface and the cooler.

SUMMARY

In the semiconductor device of Japanese Patent Application Publication No. 2001-267475, a part of the heat sink protrudes from the resin surface around the heat sink. On the other hand, due to the production cost or the like, there may be a case where a semiconductor module in which the thermal conductive surface of the heat sink is recessed with respect to the surrounding resin surface, is employed. A semiconductor module in which a part of the heat sink is exposed from a resin package is manufactured through, for example, the following processes. A resin package in which a semiconductor element and a heat sink are embedded is manufactured through injection molding process of resin. During the injection molding, the heat sink is entirely embedded in the package. After the injection molding, one surface of the package is ground such that a part of the heat sink is exposed. The exposed portion serves as the thermal conductive surface. When such a manufacturing process is involved, a temperature of a metal heat sink rises and the heat sink expands due to friction heat from the grinding. Due to the grinding, an expanded surface of the heat sink becomes flush with the surrounding resin surface. As the heat sink contracts after the grinding, a thermal conductive surface that is recessed with respect to the resin surface of the package is formed. Exposing a part of the heat sink during the injection-molding of the package requires a high cost. As described above, it is possible to save more manufacturing cost by exposing the heat sink by manufacturing first the package incorporating the embedded heat sink and then grinding wholly a surface of the package to expose the heat sink.

The inventors of the present application employed the semiconductor module in which a thermal conductive surface of a heat sink is recessed with respect to a resin surface, and to avoid the above-mentioned grease dissipation, then considered a semiconductor device in which a solid heat transfer layer is provided on an entire surface of the package including the thermal conductive surface of the heat sink and a resin surface around the thermal conductive surface, and a cooler is pressed against the semiconductor module with the heat transfer layer interposed between the cooler and the semiconductor module. It is desirable for the heat transfer layer to be retained in a compressed state of being thin between the heat sink and the cooler in order to improve its thermal conductivity from the heat sink to the cooler through the heat transfer layer. However, if the heat transfer layer is provided on an entirety of one surface of the package, due to a repulsive force of the heat transfer layer being large, large load is required to compress the heat transfer layer to a desired thickness. The present disclosure relates to a semiconductor device in which a cooler is pressed against a semiconductor module in which at least a part of a thermal conductive surface of a heat sink is recessed with respect to its surrounding resin surface and provides a technology that suppresses a load for compressing a solid heat transfer layer interposed between the heat sink and the cooler.

A semiconductor device disclosed herein comprises a semiconductor module and a cooler. The semiconductor module comprises a package made of resin containing a semiconductor element and a heat sink. The heat sink has a surface (a thermal conductive surface) exposed on a part of one surface of the package. The cooler faces the thermal conductive surface and a resin surface around the thermal conductive surface while being pressed against the semiconductor module. At least a portion of the thermal conductive surface comprises a recessed region recessed with respect to the resin surface. Further, a solid heat transfer layer is interposed between the recessed region of the thermal conductive surface and the cooler. Meanwhile the solid heat transfer layer is not interposed between the resin surface and the cooler. Since in this semiconductor device the heat transfer layer is not interposed between the resin surface of the package and the cooler, it is possible to suppress a pressing load (load for pressing the cooler against the semiconductor module) required for compressing the heat transfer layer interposed between the thermal conductive surface and the cooler to a desirable thickness.

The present disclosure also provides a desirable manufacturing method of the semiconductor device described above. The method comprises (1) forming the package so as to cover the thermal conductive surface of the heat sink with the resin and (2) grinding a portion of the resin which covers the thermal conductive surface so as to expose the thermal conductive surface. Notably, the recessed region is formed at the thermal conductive surface by the grinding. This method further comprises (3) applying a pre-solidified heat transfer material to the recessed region and planarizing a surface of the pre-solidified heat transfer material while holding the pre-solidified heat transfer material with a holder so as not to spread out the pre-solidified heat transfer material to the resin surface, (4) solidifying the pre-solidified heat transfer material; and (5) fixing the cooler and the semiconductor module with the cooler being pressed against the thermal conductive surface of the heat sink.

If a heat transfer sheet (heat transfer layer) having a constant thickness is placed on a curved region (a recessed region) of the thermal conductive surface, a surface of the heat transfer sheet (heat transfer layer) is also curved corresponding to a curvature of the thermal conductive surface. If a cooler is pressed against the heat transfer sheet (heat transfer layer) the surface of which is curved, a stress distribution becomes non-uniform in a plan view of the thermal conductive surface. On the other hand, in the above-described manufacturing method, the heat transfer layer having a flat surface and being in uniform contact with the thermal conductive surface is acquired. Since the cooler is pressed against the heat transfer layer having the flat surface, more uniform stress distribution is achieved compared to the case where the heat transfer sheet (heat transfer layer) having the constant thickness is employed. When the stress distribution is constant in the plan view of the thermal conductive surface, a uniform heat transfer property is acquired across an entirety of the heat transfer layer.

The details of the technology disclosed herein and its further improvements will be explained in the following Embodiment.

DETAILED DESCRIPTION

Embodiment

Figure 1:
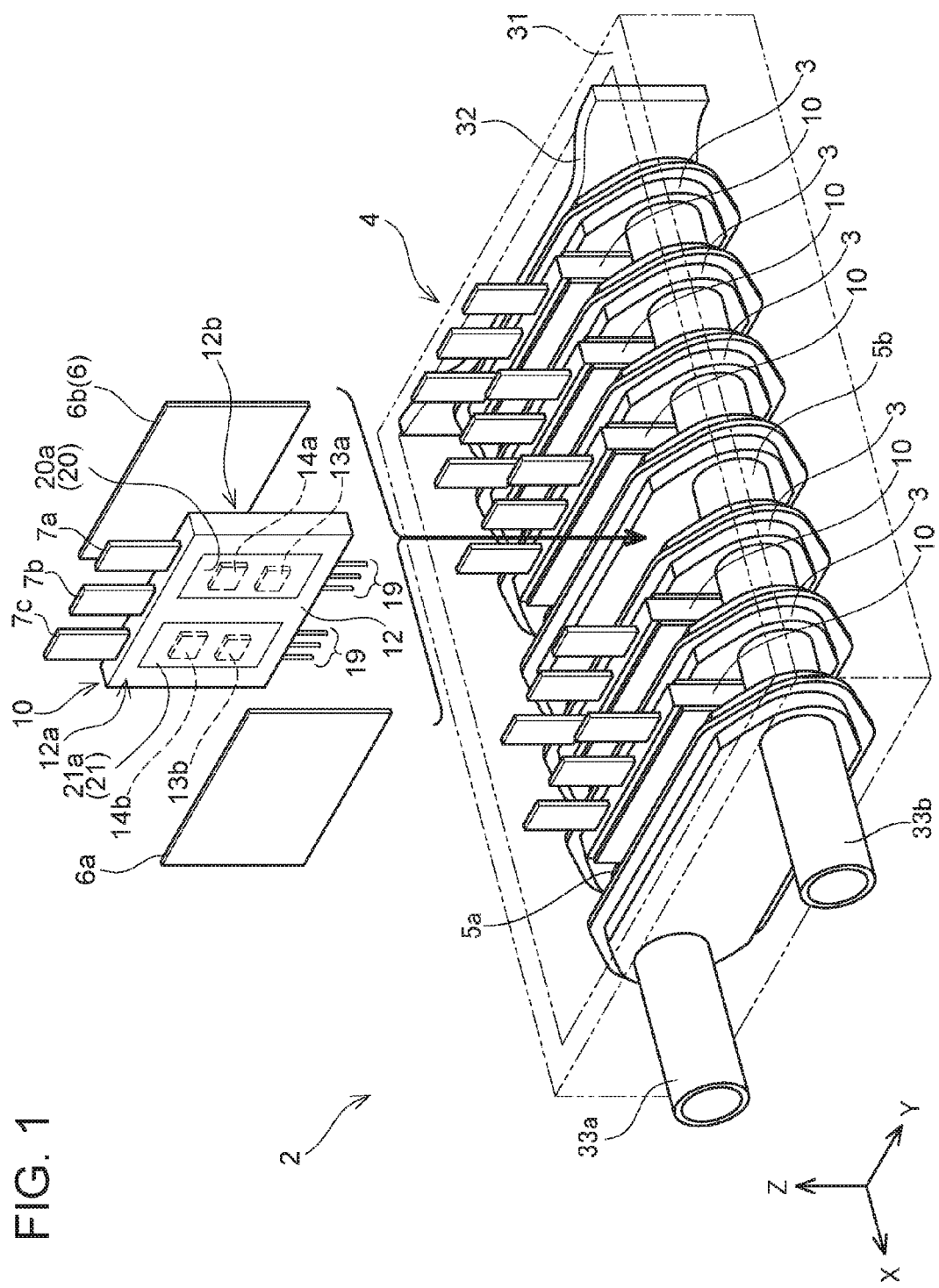
FIG. 1 is a perspective view of a semiconductor device.

A semiconductor device of Embodiment will be explained with reference to drawings. FIG. 1 is a perspective view of a semiconductor device 2 of Embodiment. The semiconductor device 2 comprises a unit (stacking unit 4) in which a plurality of semiconductor modules 10 and a plurality of cooling members 3 are stacked. Notably, in FIG. 1, a casing 31 accommodating the stacking unit 4 is shown by a virtual line for easier view of an entirety of the stacking unit 4. An insulating plate 6 is interposed between each adjacent pair of the semiconductor module 10 and the cooling member 3. In FIG. 1, for easier understanding, one semiconductor module 10 and two insulating plates 6 on both sides of the semiconductor module 10 are extracted from the stacking unit 4 to be shown. For explanation convenience, the insulating plate on one side of the semiconductor module 10 will be denoted 6a, and the insulating plate on another side of the semiconductor module 10 will be denoted 6b. When any of the insulating plates 6a and 6b is indicated without distinction, it will be referred to as "insulating plate 6". In addition, a heat transfer layer is interposed between each adjacent pair of the semiconductor module 10 and the insulating plate 6, and grease is filled between each adjacent pair of the insulating plate 6 and the cooling member 3, but the heat transfer layer and the grease are omitted in FIGS. 1 and 2. The heat transfer layer and the grease will be explained in detail in FIG. 3 and thereafter.

Each semiconductor module 10 contains four semiconductor elements, which are specifically two transistors 13a, 13b and two diodes 14a, 14b. An internal structure of each semiconductor module 10 will be explained later in detail.

The plurality of semiconductor modules 10 and the plurality of cooling members 3 both are of a flat-plate type. A main plane surface (a side surface having a largest area among respective side surfaces) of each semiconductor module 10 and a main plane surface of each cooling member 3 are stacked to face each other. The semiconductor modules 10 and the cooling members 3 are alternately stacked one by one, and the cooling members 3 are positioned respectively on both ends of the stacking unit 4 in a stacking direction. At both ends of the stacking unit 4 also, the insulating plate 6 is interposed between each adjacent pair of the semiconductor module 10 and the cooling member 3. Each semiconductor module 10 has its respective main plane surfaces each facing the corresponding cooling member 3 with the corresponding insulating plate 6 interposed between the semiconductor module 10 and the cooling member 3.

The cooling members 3 next to each other are connected by connecting pipes 5a and 5b. In FIG. 1, reference numbers "5a" and "5b" are only assigned to one pair of connecting pipes, and reference numbers are omitted from the other connecting pipes. A coolant introducing pipe 33a and a coolant discharging pipe 33b are connected to the cooling member 3 on one end in the stacking direction. The coolant is a liquid, typically water. The coolant supplied through the coolant introducing pipe 33a is distributed to all the cooling members 3 through the connection pipes 5a. The coolant absorbs heat through each insulating plate 6 from its adjacent semiconductor module 10 while passing through the cooling members 3. The coolant which has passed through the cooling members 3 passes through the connecting pipes 5b and is discharged from the coolant discharging pipe 33b. It is noted that the cooling member 3 and the insulating plate 6 constitute a cooler.

Upon putting the stacking unit 4 into the easing 31, a flat spring 32 is inserted on one end of the stacking unit 4 in the stacking direction. The flat spring 32 causes a load to be applied to the stacking unit 4 from both ends in the stacking direction. The load is, for example, 3 [kN]. As to be described later, the heat transfer layer is interposed between each adjacent pair of the insulating plate 6 and the semiconductor module 10. That is, each insulating plate 6 is firmly pressed against the semiconductor module 10 facing the insulating plate 6 by the load applied by the plate spring 32. The high load of 3 [kN] compresses the heat transfer layer to a predetermined thickness, and increases thermal conductivity from the semiconductor module 10 to the cooling member 3. Each semiconductor module 10 is deprived of heat from the facing insulating plate 6 through the heat transfer layer. Accordingly, each insulating plate 6 serves as a cooler.

Each semiconductor module 10 will be explained. Each semiconductor module 10 comprises a package 12 containing the semiconductor elements (transistors 13a and 13b, diodes 14a and 14b). The package 12 is made of resin, and the semiconductor elements are embedded in the package 12. Three power terminals 7a, 7b and 7c extend from an upper surface of the package 12 and control terminals 19 extend from a lower surface of the package 12. The transistors 13a and 13b are connected in series inside the package 12, the power terminal 7a is connected to a high potential side of the series connection, and the power terminal 7b is connected to a low potential side of the series connection. The power terminal 7c is connected to a midpoint of the series connection. Each control terminal 19 is a gate terminal connected to a gate of the transistor 13a or 13b, or a terminal of a temperature sensor (not shown). Notably, the diode 14a is connected in anti-parallel to the transistor 13a inside the package 12, and the diode 14b is connected in anti-parallel to the transistor 13b inside the package 12.

Heat sinks 20, 21 and heat sinks 22, 23, which will be described later, are embedded in the package 12. A part of a surface of the heat sink 20 and a part of a surface of the heat sink 21 are exposed on one main plane surface of the package 12 facing the cooling member 3. For explanation convenience, a part of the main plane surface of the package 12 excluding the surfaces of the heat sinks 20 and 21 will be referred to as a resin surface 12a of the package 12. A part of a surface of the heat sink 20 which is exposed from the package 12 will be referred to as a thermal conductive surface 20a, and a part of a surface of the heat sink 21 which is exposed from the package 12 will be referred to as a thermal conductive surface 21a. The resin surface 12a is a surface adjacent to peripheries of the thermal conductive surfaces 20a and 21a. A part of a surface (thermal conductive surface 22a) of the heat sink 22 and a part of a surface (thermal conductive surface 23a) of the heat sink 23 (the heat sink 22 and the heat sink 23 will be described later) are exposed on another main plane surface (a surface facing toward a negative direction in the X axis) of the semiconductor module 10. A part of the other main plane surface of the package 12 excluding the thermal conductive surfaces 22a and 23a of the heat sinks 22 and 23 will be referred to as another resin surface 12b. The semiconductor module 10 comprises the thermal conductive surfaces 20a, 21a of the heat sinks 20, 21 on the one main plane surface (one side surface of the package 12) of the package 12 and the thermal conductive surfaces 22a, 23a of the heat sinks 22, 23 on the other main plane surface (another side surface of the package 12) of the package 12.

Figure 2:
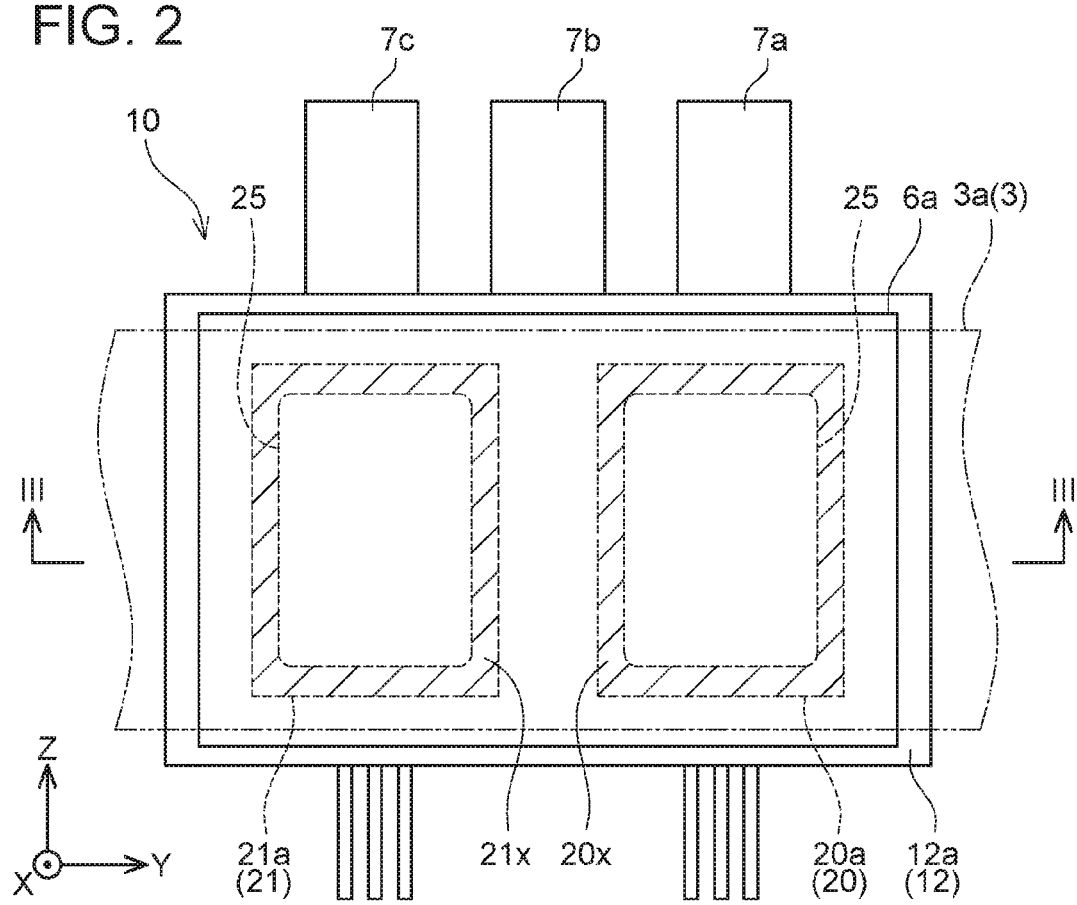
FIG. 2 is a plan view of a semiconductor module.

FIG. 2 shows a plan view of a stacked body of the semiconductor module 10 and the insulating plates 6a, 6b. The X direction of coordinate system in FIG. 2 corresponds to a normal direction of the one side surface of the package 12. Accordingly, FIG. 2 correspond to a drawing when the stacked body of the semiconductor module 10 and the insulating plates 6a , 6b is seen along the normal direction (the X direction of the coordinate system in FIG. 2) of the one side surface. FIG. 2 also corresponds to a drawing of the one side surface of the package 12 in a plan view. Further, FIG. 2 also corresponds to a drawing of the thermal conductive surfaces 20a, 21a of the heat sinks 20, 21 in a plan view.

Figure 3:
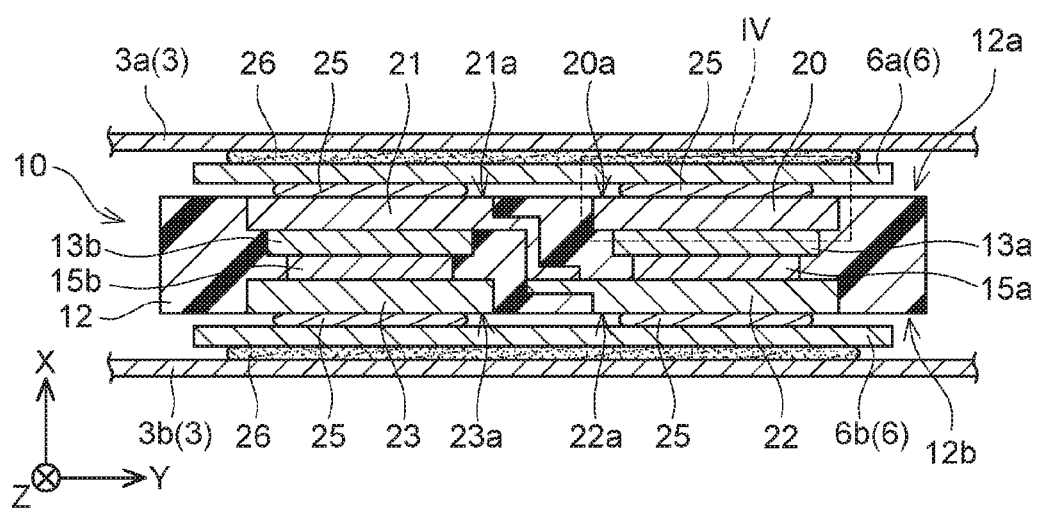
FIG. 3 is a cross sectional view taken along a line III-III of FIG. 2.

The cooling member 3 is shown by a virtual line in FIG. 2. Further, FIG. 3 shows a cross section taken along a III-III line of FIG. 2. FIG. 3 shows the cross section that intersects the transistors 13a, 13b. FIG. 3 also shows parts of the cooling members 3 on both sides of the semiconductor module 10 in the stacking unit 4. For explanation convenience, in FIGS. 2 and 3, a reference number 3a is assigned to the cooling member adjacent to the insulating plate 6a, and a reference number 3b is assigned to the cooling member adjacent to the insulating plate 6b. Notably, when any of the cooling members 3a, 3b is indicated without distinction, "cooling member 3" is used. As aforementioned, when any of the insulating plates 6a, 6b is expressed without distinction, "insulating plate 6" is used.

First, an internal structure of each package 12 will be explained with reference to FIG. 3. As aforementioned, the transistors 13a, 13b (and diodes 14a, 14b) are embedded inside the package 12. The transistors 13a, 13b are flat plate-type chips and each collector electrode is exposed on one surface of the flat plate. Each emitter electrode and each gate electrode are exposed on another surface of the flat plate. The heat sink 20 is connected to the collector electrode of the transistor 13a. As aforementioned, a part of the surface (the thermal conductive surface 20a) of the heat sink 20 is exposed from the resin surface 12a of the package 12, and serves as the thermal conductive surface. One surface of a spacer 15a is connected to the emitter electrode of the transistor 13a. The heat sink 22 is connected to another surface of the spacer 15a. A part of the surface of the heat sink 22 is exposed from the other resin surface 12b of the package 12, and serves as the thermal conductive surface 22a.

The heat sink 21 is connected to the collector electrode of the transistor 13b. As aforementioned, a part of the surface of the heat sink 21 is exposed from the resin surface 12a of the package 12, and serves as the thermal conductive surface. One surface of a spacer 15b is connected to the emitter electrode of the transistor 13b. The heat sink 23 is connected to another surface of the spacer 15b. A part of the heat sink 23 is exposed from the other resin surface 12b of the package 12, and serves as the thermal conductive surface. In other words, the semiconductor module 10 comprises the package 12 made of resin containing the semiconductor elements (transistors, diodes) and the heat sinks 20 to 23, and a part of each of the heat sinks 20 to 23 connected to the semiconductor elements inside the package 12 is exposed on a part of a corresponding side surface of the package 12.

The heat sinks 20, 21, 22, 23 and the spacers 15a, 15b are made of copper. Notably, the spacer 15a is bonded to the heat sink 22 and can be regarded as a part of the heat sink 22. The spacer 15b is bonded to the heat sink 23 and can be regarded as a part of the heat sink 23. Hereinbelow, the heat sink 22 and the spacer 15a will be collectively referred to as the heat sink 22, and the heat sink 23 and the spacer 15b will be collectively referred to as the heat sink 23.

As shown in FIG. 3, the heat sink 21 and the heat sink 22 are connected inside the package 12. The emitter of the transistor 13a and the collector of the transistor 13b are electrically connected via the heat sink 21 and the heat sink 22. That is, the transistor 13a and the transistor 13b are connected in series. Although not shown, inside the package 12, the heat sink 20 is electrically connected to the power terminal 7a, and the heat sink 23 is electrically connected to the power terminal 7b. The heat sinks 21, 22 are electrically connected to the power terminal 7c. That is, the heat sinks 20 to 23 serve as a part of terminals connecting the electrodes of the transistors 13a, 13b to an external device. On the other hand, the cooling members 3 are made of electrically-conductive metal. The insulating plates 6 are respectively interposed between the cooling members 3 and the heat sinks 20 to 23 in order to insulate the cooling members 3 from the heat sinks 20 to 23.

As shown in FIG. 3, the insulating plate 6a faces the resin surface 12a of the package 12 and the thermal conductive surfaces 20a, 21a of the heat sinks 20, 21. The insulating plate 6b faces the other resin surface 12b of the package 12 and the thermal conductive surfaces 22a, 23a of the heat sinks 22, 23. The insulating plates 6a, 6b are pressed against the semiconductor module 10 by the flat spring 32 (see FIG. 1). In other words, the insulating plate 6a is pressed against the semiconductor module 10 while facing the resin surface 12a and the thermal conductive surfaces 20a, 21a. The insulating plate 6b is pressed against the semiconductor module 10 while facing the other resin surface 12b and the thermal conductive surfaces 22a, 23a.

The heat transfer layers 25 are interposed between the thermal conductive surface 20a and the insulating plate 6a, and between the thermal conductive surface 21a and the insulating plate 6a. As understood from FIGS. 2, 3, the heat transfer layers 25 are interposed respectively between the thermal conductive surfaces 20a, 21a and the insulating plate 6a while the heat transfer layer 25 is not interposed between the insulating plate 6a and the resin surface 12a around the thermal conductive surfaces 20a, 21a. In other words, each heat transfer layer 25 exists only within a range of the thermal conductive surface 20a or 21a, and does not extend over to a range of the resin surface 12a around the thermal conductive surfaces 20a and 21a when the package 12 is seen in a plan view. Similarly, the heat transfer layers 25 are interposed respectively between the thermal conductive surface 22a and the insulating plate 6b and between the thermal conductive surface 23a and the insulating plate 6b. The heat transfer layer 25 is not interposed between the insulating plate 6b and the resin surface 12b around the thermal conductive surfaces 22a, 23a. The heat transfer layers 25 have a high thermal conductivity, are solid, and do not have fluidity but are flexible. The heat transfer layers 25 are for example, constituted of silicone gel. Non-solid grease is applied between each adjacent pair of the insulating plate 6 and the cooling member 3. The grease is used as a heat transfer material.

As aforementioned, the heat sinks 20 to 23 are respectively connected to the transistors inside the package 12, and a part (the thermal conductive surfaces 20a to 23a) of the surface of each of the heat sinks 20 to 23, is exposed from the resin surface 12a or 12b of the package 12. The solid and flexible heat transfer layers 25 are interposed between the insulating plates 6 and the thermal conductive surfaces 20a to 23a, and the grease 26 is interposed between each adjacent pair of the insulating plate 6 and the cooling member 3. According to this structure, heat from the transistors 13a, 13b embedded in the package 12 is absorbed by the cooling members 3 via the heat sinks 20 to 23, the heat transfer layers 25, the insulating plates 6 and the grease 26.

The explanation will be complemented regarding a range where the heat transfer layers 25 exist with reference to FIG. 2. FIG. 2 corresponds to a plan view of the one side surface of the package 12. In the plan view of FIG. 2, margin regions where no heat transfer layer exists are provided each between an outer periphery of the heat transfer layer 25 and an outer periphery of one of the thermal conductive surfaces 20a and 21a. In FIG. 2, hatched regions with right upward lines indicate margin regions 20x, 21x. The margin regions 20x and 21x are provided such that the solid heat transfer layers 25 are securely positioned between the insulating plate 6 and the thermal conductive surfaces 20a, 21a. The margin regions are also provided between the thermal conductive surfaces 22a, 23a of the heat sinks 22, 23, and the heat transfer layer 25 on the insulating plate 6b side.

Figure 4:
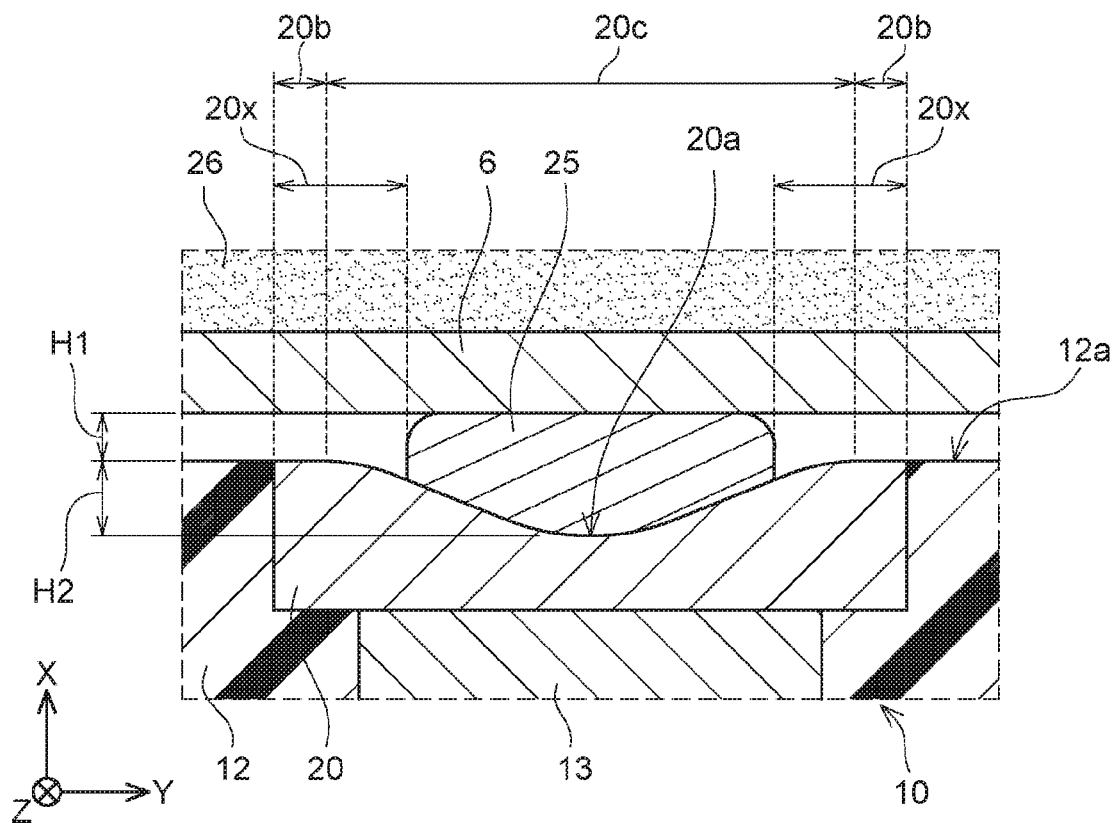
FIG. 4 is an enlarged cross sectional view of a region surrounded by a broken line IV of FIG. 3.

An advantage achieved by limiting the positions of the heat transfer layers 25 to between each insulating plate 6 and the corresponding ones of the thermal conductive surfaces 20a to 23a of the heat sinks 20 to 23, will be explained. FIG. 4 shows an enlarged view of a rectangle range surrounded by a broken line indicated by reference number IV in FIG. 3. The thermal conductive surface 20a and the corresponding heat transfer layer 25 will be explained more with reference to the enlarged cross sectional view of FIG. 4. In the subsequent drawings, reference number 6 will be assigned to the insulating plates. Notably, respective relationships between the corresponding heat transfer layer 25 and each of the thermal conductive surfaces 21a, 22a, 23a are the same as the relationship between the corresponding heat transfer layer 25 and the thermal conductive surface 20a. In FIG. 4 (and FIGS. 7 to 10 to be later explained) the dimension in a vertical direction is shown expanded for easier understanding.

The thermal conductive surface 20a is gently curved and recessed from the resin surface 12a around the thermal conductive surface 20a. Notably, the thermal conductive surface 20a is flat and flush with the resin surface 12a in a vicinity of a boundary between the thermal conductive surface 20a and the resin surface 12a (the vicinity being a range indicated by reference number 20b in FIG. 4). Further, an inner side (a range indicated by reference number 20c in FIG. 4) of the flat range is recessed with respect to the resin surface 12a. More specifically, the thermal conductive surface 20a is flat and flush with the resin surface 12a in the vicinity of the boundary (the range indicated by reference number 20b in FIG. 4), and is gently curved and recessed with respect to the resin surface 12a in a range on the inner side (the range indicated by reference number 20c in FIG. 4)

than the flat range. Hereinbelow, the recessed region of the thermal conductive surface 20a may be referred to as a recess 20c.

A depth H2 of the recess 20c is approximately 10 to 50 microns. The depth H2 of the recess 20c, in other words, corresponds to a distance from the resin surface 12a to a bottom of the recess 20c. A thickness of the heat transfer layer 25 may preferably be retained thin and brought into intimate contact with the semiconductor module 10 with an appropriate pressure for a higher thermal conductivity from the semiconductor module 10 to the insulating plate 6. Accordingly, as aforementioned, the insulating plate 6 is pressed against the semiconductor module 10 while facing the thermal conductive surface 20a and the resin surface 12a. The heat transfer layer 25 is compressed by the pressing force. The heat transfer layer 25 is in a solid state and is substantially elastic. A gap having a width H1 is formed between the resin surface 12a and the insulating plate 6 due to a balance between the pressing force and a repulsive force of the heat transfer layer 25. The width H1 of the gap between the resin surface 12a and the insulating plate 6 may be preferably made as small as possible in order to thin the thickness of the heat transfer layer 25 between the bottom of the recess 20c of the thermal conductive surface 20a and the insulating plate 6. Notably, the gap width H1 may be approximately 10 microns. Meanwhile, as a range of the heat transfer layer becomes larger in the plan view of the one surface of the semiconductor module 10, the repulsive force of the heat transfer layer increases and a larger load is required to make the heat transfer layer to have a predetermined thickness. That is, if the heat transfer layer 25 extends over to the resin surface 12a, a larger load is needed to thin the heat transfer layer 25. As the load for pressing the insulating plate 6 to the semiconductor module 10 becomes larger, the cost for retaining the heat transfer layer 25 thin is increased. In the semiconductor device 2 of Embodiment, the solid heat transfer layer 25 is provided between the insulating plate 6 and the thermal conductive surface 20a (and 21a to 23a) of the heat sinks 20 (and 21 to 23) each having a high thermal conductivity while the solid heat transfer layer 25 is not interposed between the insulating plate 6 and the resin surface 12a or 12b of the package 12 having a low thermal conductivity compared to the heat sinks 20 to 23. Accordingly, the repulsive force of the heat transfer layer 25 may be made small. As a result of this, the pressing load (a load for pressing the insulating plate 6 against the semiconductor module 10) for thinning the thickness of the heat transfer layer 25 may be made small. Due to this, the increase in the cost for retaining the heat transfer layer 25 thin may be suppressed.

As shown in FIG. 4, the heat transfer layer 25 is provided in the recessed region (range indicated by reference number 20c in FIG. 4) of the thermal conductive surface 20a, but is not interposed between the insulating plate 6 and the flat portion (a flat portion flush with the resin surface 12a, and the range indicated by the reference number 20b in FIG. 4) of the thermal conductive surface 20a in the vicinity of the boundary between the thermal conductive surface 20a and the resin surface 12a. The heat transfer layer 25 is limited to a range of the curved surface of the thermal conductive surface 20a, and thereby the pressing load for thinning the heat transfer layer 25 can effectively be suppressed without reducing the thermal conductivity from the thermal conductive surface 20a to the insulating plate 6 so much. Notably, in FIG. 4, a range from the boundary between the resin surface 12a and the thermal conductive surface 20a to the heat transfer layer 25 corresponds to the aforementioned margin region 20x.

Figure 5:
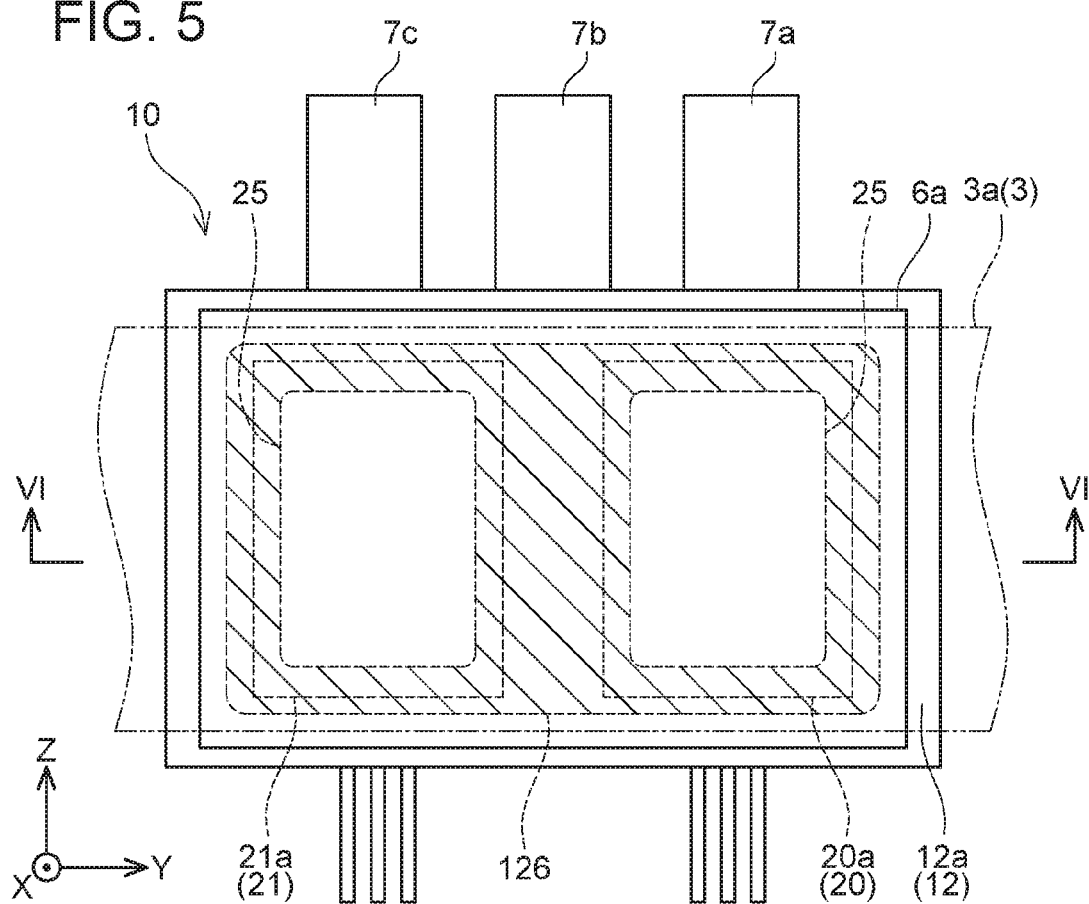
FIG. 5 is a plan view of a variant of a semiconductor module.
Figure 6:
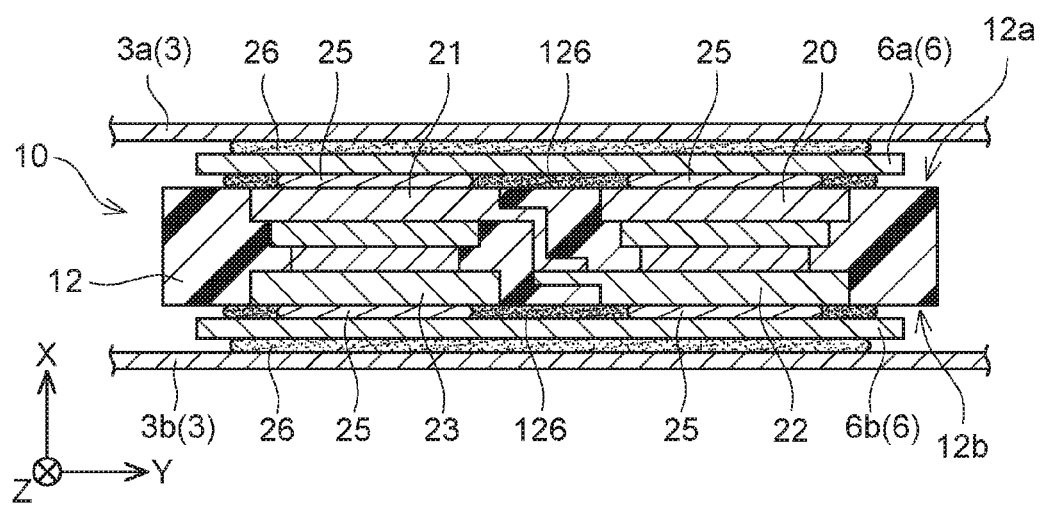
FIG. 6 is a cross sectional view taken along a line VI-VI of FIG. 5.

Next, a variant of the semiconductor device will be explained with reference to FIGS. 5 and 6. FIG. 5 is a plan view of the insulating plate 6 and the semiconductor module 10 of the variant of the semiconductor device, and FIG. 6 is a cross sectional view taken along a line VI-VI of FIG. 5. FIG. 5 and FIG. 6 correspond to FIG. 2 and FIG. 3, respectively. Thus, as to the same components as those explained in FIGS. 2 and 3, some reference numbers are omitted. In FIG. 5, the cooling member 3a is shown by a virtual line. In the variant in FIGS. 5 and 6, grease 126 is filled around each heat transfer layer 25 in a plan view (FIG. 5) of the semiconductor module 10. The grease 126 is non-solid heat transfer material and has fluidity. A hatched range with right downward lines in FIG. 5 indicates the grease 126. The grease 126 is filled between the package 12 and the insulating plate 6a to surround the heat transfer layers 25 in the plan view of one side surface (one side surface of the package 12 including the thermal conductive surface of the heat sink) of the package 12. The grease 126 is similarly filled between the package 12 and the insulating plate 6b as well. The grease 126 assists in heat transfer from the package 12 to the insulating plates 6 in a region where the heat transfer layer 25 is not interposed. Since the grease has fluidity, the pressing load (load pressing the insulating plates 6 against the semiconductor module 10) would not be much increased. In other words, the non-solid grease 126 would not increase the pressing load for thinning the heat transfer layers 25.

Figure 7:
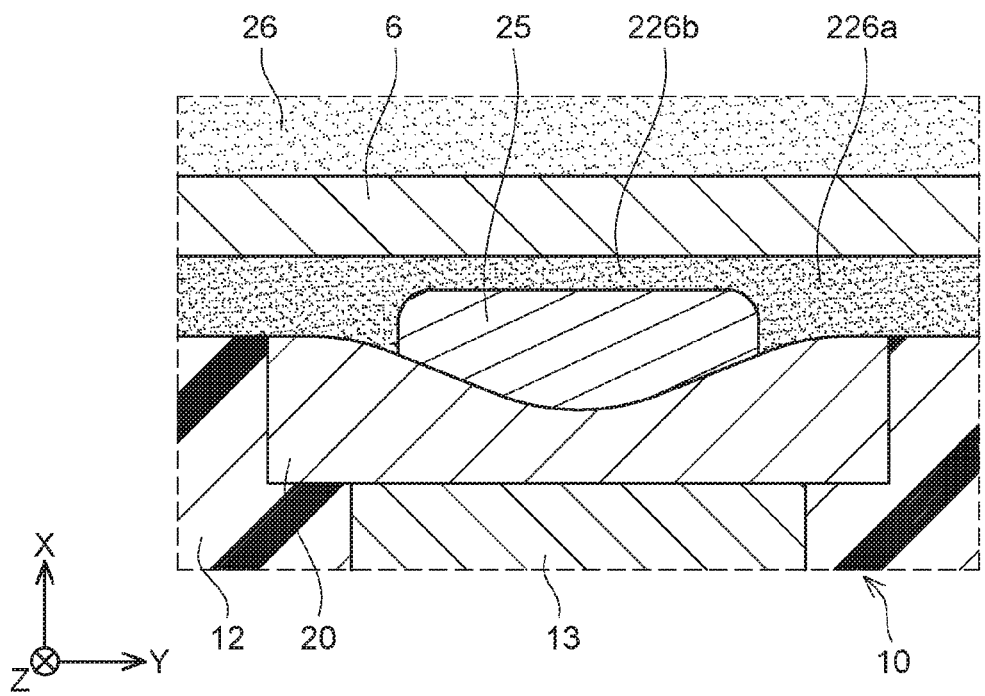
FIG. 7 is an enlarged cross sectional view of another variant.

Next, another variant will be explained with reference to FIG. 7. FIG. 7 is an enlarged cross sectional view of the variant in a range corresponding to the range indicated by the broken line rectangle IV in FIG. 3. In this variant, similarly to the aforementioned variant, grease 226a is filled between the insulating plates 6 and the package 12 to surround the solid heat transfer layers 25 when one side surface of the package 12 is seen in a plan view. In this variant, non-solid grease 226b is also filled between the heat transfer layer 25 and the insulating plate 6. Both of the grease 226a and the grease 226b are non-solid heat transfer material and have fluidity. Since the heat transfer layers 25 are solid, they have microscopic irregularities on their surfaces. The grease 226b enters into the irregularities to promote heat transfer from the heat transfer layers 25 to the insulating plates 6. Since the grease 226a and 226b have fluidity, the pressing load would not be largely increased thereby. Notably, the grease 226a may be of the same type as or a different type from the grease 226b. For example, the grease 226b may have lower viscosity than the grease 226a. By employing low-viscous grease, a layer of the grease between the heat transfer layer 25 and the insulating plate 6 may be made thin. Further, the high viscous grease 226a surrounding the grease 226b prevents diffusion of the tow viscous grease 226b to its surroundings.

Figure 8:
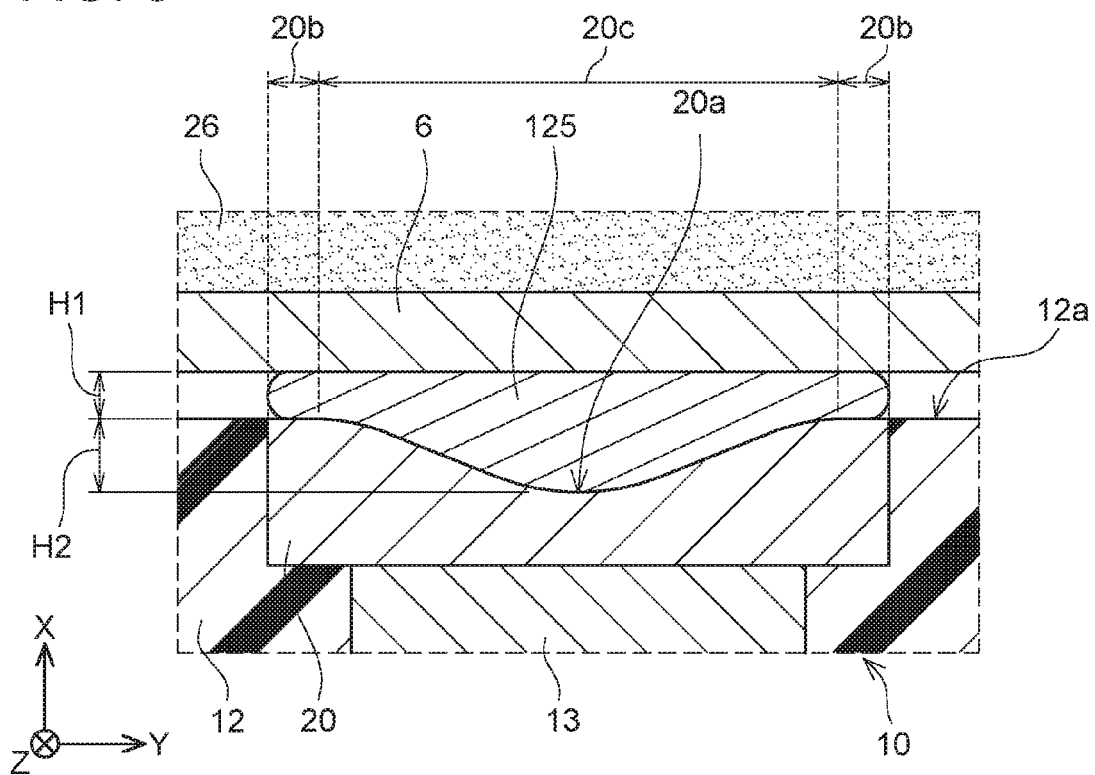
FIG. 8 is an enlarged cross sectional view of still another variant.

Next, still another variant will be explained with reference to FIG. 8. FIG. 8 is an enlarged cross sectional view of the variant (different variant from those in FIGS. 5 to 7) in a range corresponding to the range indicated by the broken line rectangle IV in FIG. 3. In the variant of FIG. 8, a heat transfer layer 125 is provided between the insulating plate 6 and an entirety of the thermal conductive surface 20a including the flat portion (range indicated by reference number 20b in FIG. 8), which is flush with the resin surface 12a. Notably, the heat transfer layer 125 is not interposed between the resin surface 12a of the package 12 and the insulating plate 6. That is, the heat transfer layer 125 is provided in the recessed region of the thermal conductive surface 20a (range indicated by the reference number 20c in FIG. 8) and the heat transfer layer 125 is also provided in the region flush with the resin surface 12a of the thermal conductive surface 20a (range indicated by the reference number 20b). In this variant, although the pressing load increases compared to that in FIG. 4, the heat transfer performance from the heat sink 20 to the insulating plate 6 is high since the thermal conductive surface 20a may be used to with its maximum size.

Figure 9:
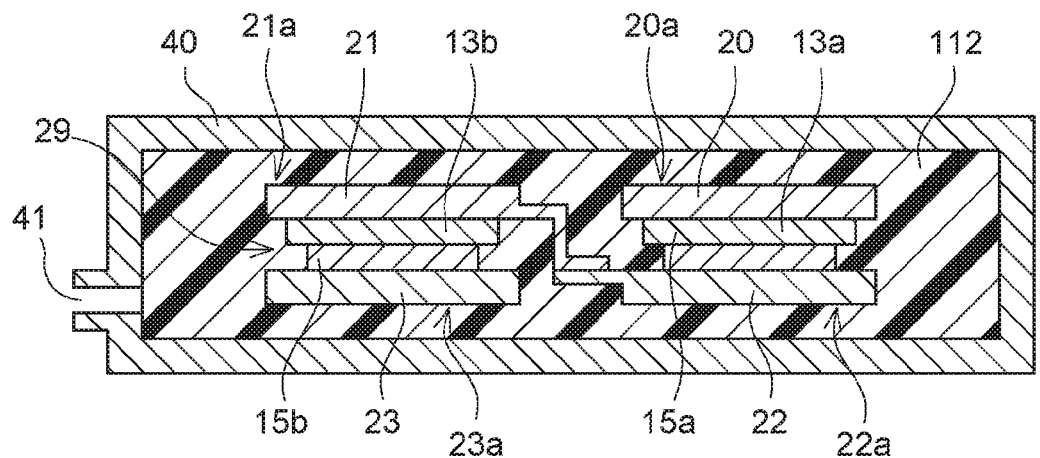
FIG. 9 is a view (1) explaining a manufacturing method of the semiconductor device.

Next, a manufacturing method of the semiconductor device 2 will be explained with references to FIGS. 9 to 13. First, an assembly of components including heat sinks, transistors and the like is prepared, and a resin package 12 (semi-finished package) sealing the assembly is formed by injection molding (molding process). FIG. 9 is a cross section in a state where resin is injected into a mold 40 accommodating the assembly 29 such that the package (semi-finished package 112) covering an entirety of the assembly 29 is formed. The assembly 29 comprises the aforementioned heat sinks 20 to 23, the transistors 13a, 13b, the diodes 14a, 14b, and the spacers 15a, 15b. Notably, in the cross section in FIG. 9, the diodes 14a and 14b are not seen. Further, in the assembly 29, the power terminals 7a to 7c shown in FIG. 2 are supported at a portion not shown in the cross section of FIG. 9. When molten resin is injected from a gate 41 of the mold 40 and the mold 40 is cooled down, then the package (semi-finished package 112) covering the thermal conductive surfaces 20a to 23a of the heat sinks 20 to 23 is formed.

Figure 10:
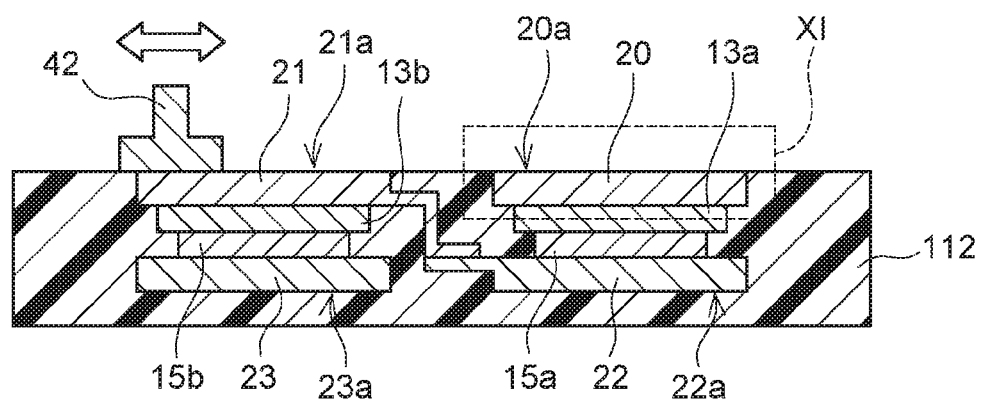
FIG. 10 is a view (2) explaining the manufacturing method of the semiconductor device.

Next, the semi-finished package 112 is taken from the mold 40, portions of the semi-finished package 112 that covers the thermal conductive surfaces 20a to 23a are ground to expose the thermal conductive surfaces 20a to 23a from the semi-finished package 112 (grinding process). FIG. 10 shows a state where an upper surface of the semi-finished package 112 is ground by a grinder 42 and the thermal conductive surfaces 20a and 21a are exposed. Notably, since a surface opposite from the thermal conductive surfaces 20a and 21a, i.e., a lower surface 112b is not ground yet at this point, the lower side thermal conductive surfaces 22a, 23a of the heat sinks 22, 23 are not yet exposed from the semi-finished package 112. By grinding the lower surface 112b also, the package 12 in which the thermal conductive surfaces 22a, 23a of the heat sinks 22, 23 are exposed is completed.

The grinding process will be hereinafter explained by referring the heat sink 20 as an example. By grinding the surface of the heat sink 20 along with the resin package (the semi-finished package 112) by the grinder 42, the thermal conductive surface 20a of the heat sink 20 comes to be flush with the resin surface 12a therearound. Notably, as the surface of the heat sink 20 is ground, temperature of the heat sink 20 constituted of metal rises due to friction heat from the grinding and thus the heat sink 20 expands. The surface of the heat sink 20 is ground in an expanded state to be flush with the resin surface 12a. After the grinding, the temperature of the heat sink 20 falls, the heat sink 20 contracts, and accordingly a curved region (recessed region) recessed with respect to the resin surface 12a is formed in the thermal conductive surface 20a. A portion flush with the resin surface 12a may sometimes remain in the thermal conductive surface 20a in a vicinity of the boundary between the thermal conductive surface 20a and the resin surface 12a. The same applies to the heat sinks 21 to 23, the curved recess (recessed region) is also formed in the thermal conductive surfaces 21a to 23a. That is, in the grinding process the recessed region is formed in at least a part of each thermal conductive surface.

The subsequent processes will be explained with reference to enlarged cross sectional views (FIGS. 11 to 13) corresponding to a range indicated by a broken line rectangle XI in FIG. 10. Hereinbelow, the manufacturing method of the semiconductor device will be explained, mainly focusing on a method for forming the heat transfer layer 25 which makes intimate contact with the thermal conductive surface 20a of the heat sink 20. The heat transfer layers between the other thermal conductive surfaces and the insulating plates can be formed in the same manner.

Figure 11:
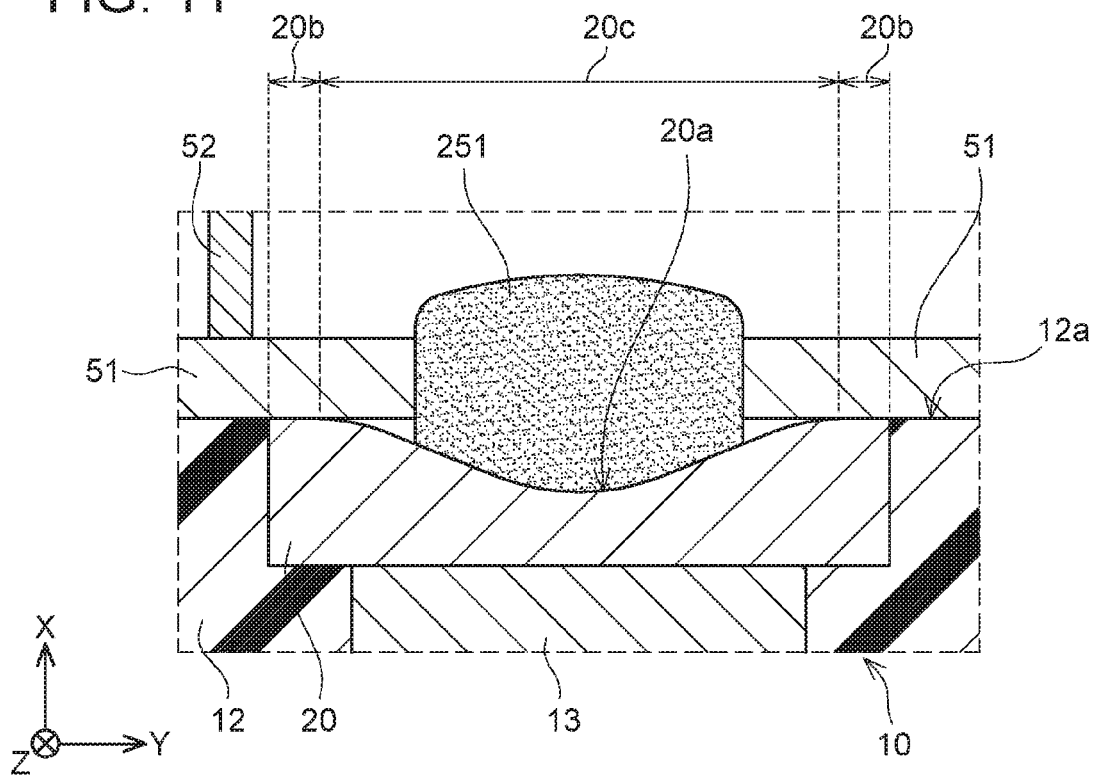
FIG. 11 is a view (3) explaining the manufacturing method of the semiconductor device.
Figure 12:
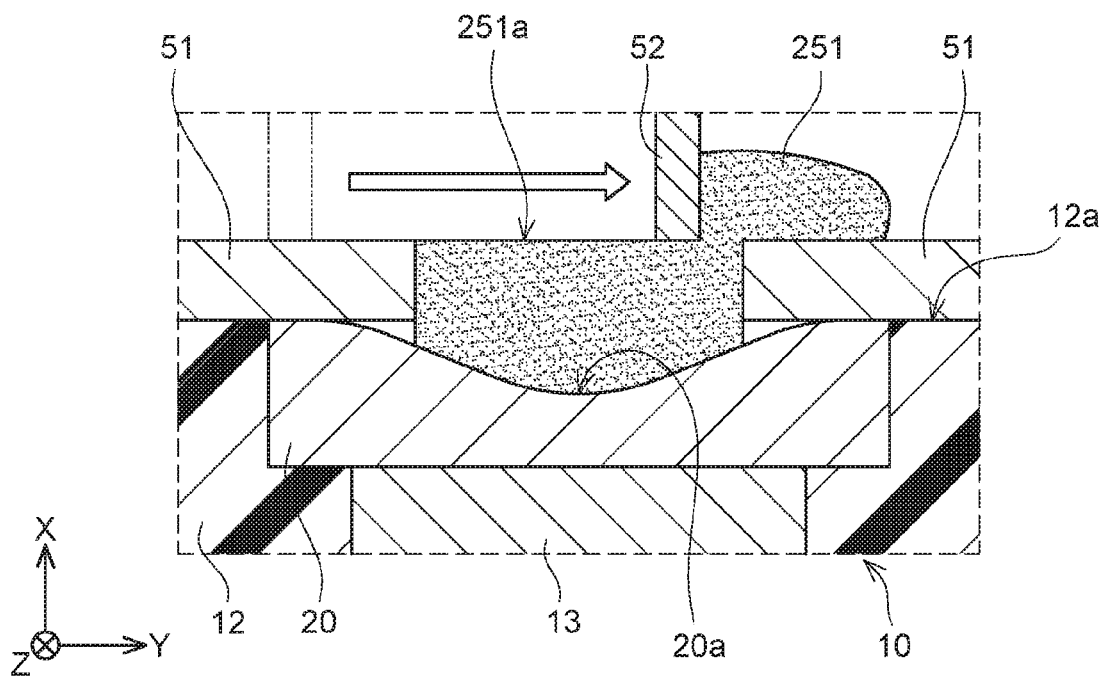
FIG. 12 is a view (4) explaining the manufacturing method of the semiconductor device.

In a subsequent process, pre-solidified heat transfer material (i.e., heat transfer material not solidified yet) is applied to the recessed region (recess 20c) in the thermal conductive surface 20a of the heat sink 20, and a surface of the heat transfer material is planarized while the heat transfer material is held using a holder so as not to spread the pre-solidified heat transfer material over to the resin surface 12a (applying process). A mask 51 having an opening corresponding to the thermal conductive surface 20a is placed on the resin surface 12a of the package 12, and heat transfer material 251 is applied on the thermal conductive surface 20a through the opening (FIG. 11). In FIG. 11, a reference number 20b indicates a range in the thermal conductive surface 20a that is flush with the resin surface 12a. The mask 51 covers completely the resin surface 12a of the package 12 and also covers the range flush with the resin surface 12a in the thermal conductive surface 20a. The mask 51 has the opening in the recessed region (recess 20c) in the thermal conductive surface 20a. The mask 51 holds the heat transfer material 251 so as not to spread the heat transfer material 251 over to the resin surface 12a. The mask 51 holds the heat transfer material 251 so as not to spread the heat transfer material 251 also over to the range flush with the resin surface 12a in the thermal conductive surface 20a. The heat transfer material 251 is a paste like substance having fluidity and high viscosity. Since the heat transfer material 251 has high viscosity, the heat transfer material 251 is retained in a state of being swollen upward with respect to the surface of the mask 51. The heat transfer material 251 is made of a material that is solidified by being heated. That is, it is the heat transfer material not solidified yet that is applied. The surface of the mask 51 is swept by a squeegee 52 while holding the heat transfer material 251 by the mask 51 such that the heat transfer material 251 is not spread (FIG. 12). The squeegee 52 is a wiper having an end to which a rubber blade is attached. After the surface of the mask 51 has been swept, a surface 251a of the heat transfer material 251 in a paste form is planarized to be the same plane as the surface of the mask 51.

Figure 13:
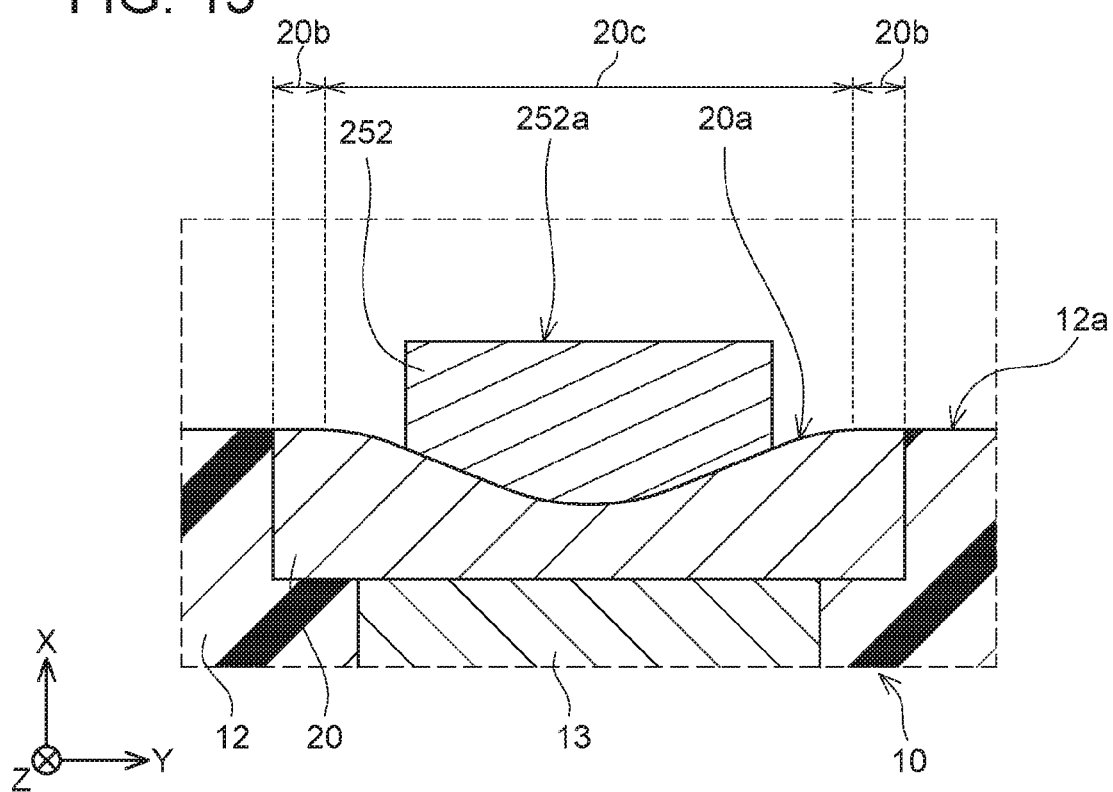
FIG. 13 is a view (5) explaining the manufacturing method of the semiconductor device.

Next, the heat transfer material 251 is solidified (solidifying process). That is, the heat transfer material 251 is heated to be solidified with the mask 51 remaining. The heat transfer material 251 is solidified while it is being held by mask 51 so as not to spread over to the resin surface 12a and with the surface 251a of the heat transfer material 251 maintained flat. The mask 51 is removed after the solidification of the heat transfer material 251, a solid heat transfer layer 252 having a flat surface 252a is formed on the thermal conductive surface 20a (FIG. 13). Due to the mask 51, the solid heat transfer layer 252 is not spread to between the resin surface 12a of the package 12 and the insulating plate 6. The heat transfer layer 252 stays in the recessed region (recess 20c) in the thermal conductive surface 20a, and is not spread over to the region flush with the resin surface 12a (range indicated by the reference number 20b in the drawings). Notably, the heat transfer layers 252 are formed on the thermal conductive surfaces of all the heat sinks, respectively. The heat transfer layers 252 are solid but flexible.

Next, the cooling members 3 are aligned in parallel and the semiconductor modules 10 along with the insulating plates 6 are each interposed between the cooling members 3 next to each other. As explained with reference to FIG. 1, the stacking unit 4 in which the plurality of cooling members 3 and the plurality of semiconductor modules 10 are stacked is put in the casing 31 while applying load to the stacking unit 4 in the stacking direction by the plate spring 32. That is, the semiconductor modules 10 and the insulating plates 6 are fixed in a state where the insulating plates 6 are pressed against the respective semiconductor modules 10 such that the insulating plates 6 face the thermal conductive surfaces 20a (and the other thermal conductive surfaces) at which the heat transfer layers 252 are formed and the resin surface 12a (fixing process). As shown in FIG. 13, each heat transfer layer 252 before being loaded has the surface 252a which is flat. Since the flat insulating plate 6 is pressed against the flat surface 252a, a homogeneous stress distribution is obtained over an entirety of each heat transfer layer 252 when one side surface (side surface including the thermal conductive surface 20a) of the package 12 is seen in the plan view. As a result of this, a homogeneous heat transfer property is obtained over the entirety of each heat transfer layer 252 when the one side surface of the package 12 is seen in a plan view. Further, since the fluid heat transfer material is applied on the thermal conductive surfaces of the heat sinks and solidified, each heat transfer layer to be formed makes intimate contact with the corresponding thermal conductive surface. This also contributes to an improvement of the heat transfer property from the heat sink to the insulating plate.

Points to be noted regarding the technology described in Embodiment will be explained. First, the variants shown in FIGS. 5 to 7 will be complemented. The variants in FIGS. 5 to 7, the grease 126 is filled between the package 12 and each of the insulating plates 6 to surround the corresponding solid heat transfer layers 25. In each semiconductor module 10, a gap between the insulating plate 6 and the resin surface 12a adjacent to the thermal conductive surface of the heat sink (gap width H1 in FIG. 4) is smaller than a gap between the insulating plate 6 and the bottom of the recess 20c in the thermal conductive surface (gap width H2+H1 in FIG. 4). Thus, the thickness of the layer of the grease 126 is smaller than the thickness of each heat transfer layer 25. Since the grease 126 is thin, the degree of assisting of heat transfer by the grease 126 from the semiconductor module 10 to the insulating plates 6 is large. In this respect, for example, in the semiconductor module in which a part of the heat sink protrudes from the package, a gap between the insulating plate (cooler) and a resin surface around the protruding portion of the heat sink is large. Thus, even if grease is filled between the insulating plate (cooler) and the resin surface of the package, the degree of assisting heat transfer from the semiconductor module to the insulating plate by the grease is little compared to the variants explained in FIGS. 5 to 7. In the variants in FIGS. 5 to 7, high heat transfer property from the semiconductor module to the insulating plates may be obtained by the solid heat transfer layers and the grease filled in its periphery. That is, each semiconductor device of the variants in FIGS. 5 to 7 has a high cooling performance of the semiconductor module.

The solid heat transfer layers of Embodiment are made of a heat transfer material that is solidified by heating. The solid heat transfer layers may be constituted of a heat transfer material that is solidified by mixing two different liquids or of a heat transfer material solidified by radiation of light. The pre-solidified material may have, for example, a viscosity of 40 [Pa·S], a thermal conductivity of 1.1 [W/mk]. Further, the solid heat transfer layers may have, for example, 21 of a measured value by durometer (type A).

As shown in FIG. 2, in the semiconductor device of Embodiment. Then the one side surface of the package 12 is seen in the plan view, the margin regions 20x, 21x, in each of which the heat transfer layer 25 is not interposed, are provided between the outer periphery of each heat transfer layer 25 and an outer periphery of the thermal conductive surfaces 20a, 21a. The margin regions 20x, 21x are provided for securely positioning the solid heat transfer layers 25 respectively between the insulating plate 6 and the thermal conductive surfaces 20a, 21a. Further, by providing the margin regions 20x, 21x, the following advantages may be obtained: each heat transfer layer 25 contacting the insulating plate 6 may be downsized; the repulsive force of the heat transfer layer 25 may be made small; and the pressing load may be further reduced.

As aforementioned, the thermal conductive surfaces 20a, 21a are flush with the resin surface 12a in the vicinity of the boundary between the thermal conductive surfaces 20a, 21a and the resin surface 12a, but are recessed at a region on the inner side than the flush region. Parts of the thermal conductive surfaces 20a, 21a are gently recessed. When the package 12 is seen in the plan view, each of the margin regions 20x, 21x may include the flush region with the resin surface 12a. That is, the heat transfer layer 25 is provided in each recessed region, and is not interposed between the cooler and the region flush with the resin surface of the thermal conductive surface of the heat sink. By narrowing the range of the heat transfer layer, the pressing load for making the heat transfer layer to a predetermined thickness may be suppressed.

On the other hand, as shown in FIG. 8, an aspect in which the heat transfer layer spreads to the recessed region of the thermal conductive surface and the region flush with the resin surface of the thermal conductive surface offers another effect. The grease dissipation may not occur in the heat transfer layer. Thus, the solid heat transfer layer spreads to the region flush with the resin surface, and thereby high cooling efficiency from the thermal conductive surface to the cooler through the heat transfer layer may be retained for a long period of time. Whether or not the solid heat transfer layer spreads to the region flush with the resin surface may be determined according to a purpose such as, for example, putting importance on reduction of the pressing load and maintenance of the cooling efficiency for a long period of time.

In the manufacturing method with reference to FIGS. 9 to 13, the heat transfer layer is formed in the recessed region of the thermal conductive surface 20a, and is not formed in the range flush with the resin surface 12a. The opening of the mask 51 may be widened, and the solid heat transfer layer may be formed both in the recessed region and in the flush region. It should be however noted that the heat transfer layer is formed so as not to be spread onto the resin surface 12a.

Prior to the process for fixing each semiconductor module 10 and the corresponding insulating plates 6, a process for applying grease to the periphery or surface of each heat transfer layer 25, may be added. By applying the grease to the periphery of each heat transfer layer 25, the variant shown in FIGS. 5, 6 can be obtained. By applying the grease to the periphery and the surface of each heat transfer layer 25, the semiconductor device of the variant shown in FIG. 7 can be obtained.

The insulating plates 6 correspond to an example of the "cooler". The cooler is not limited to the insulating plate. As to the semiconductor modules 10 in the semiconductor device of Embodiment, the insulating plates (coolers) are pressed against its both sides of each semiconductor module 10. The technology disclosed herein may be applied to a semiconductor device in which the cooler is pressed against only one side of the semiconductor module. Further, the technology disclosed herein may be applied to a semiconductor device in which a step-like recessed region is provided on the thermal conductive surface of the heat sink.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. A semiconductor device comprising:
   a semiconductor module comprising a package containing a semiconductor element and a heat sink, the package being made of resin, the heat sink having a thermal conductive surface exposed on a portion of one surface of the package;
   a cooler facing the thermal conductive surface and a resin surface around the thermal conductive surface, the cooler being pressed against the semiconductor module;
   wherein
   the thermal conductive surface comprises a recessed region recessed with respect to the resin surface,
   a solid heat transfer layer is interposed between the recessed region of the thermal conductive surface and the cooler, and the solid heat transfer layer is not interposed between the resin surface and the cooler.

2. The semiconductor device of claim 1, wherein
   the thermal conductive surface includes a flush region that is flush with the resin surface at a boundary between the thermal conductive surface and the resin surface, the recessed region being disposed on an inner side than the flush region,
   the solid heat transfer layer is provided within the recessed region, and the solid heat transfer layer is not interposed between the flush region and the cooler.

3. The semiconductor device of claim 2, wherein
   a non-solid heat transfer material is filled between the package and the cooler so that the non-solid heat transfer material surrounds the solid heat transfer layer in a plan view of the one surface of the package.

4. The semiconductor device of claim 3, wherein the non-solid heat transfer material is filled between the solid heat transfer layer and the cooler.

5. The semiconductor device of claim 1, wherein
   the thermal conductive surface includes a flush region that is flush with the resin surface at a boundary between the thermal conductive surface and the resin surface, the recessed region being disposed on an inner side than the flush region, and
   the solid heat transfer layer is provided within both of the recessed region and the flush region.

6. The semiconductor device of claim 5, wherein
   a non-solid heat transfer material is filled between the package and the cooler so that the non-solid heat transfer material surrounds the solid heat transfer layer in a plan view of the one surface of the package.

7. The semiconductor device of claim 6, wherein the non-solid heat transfer material is filled between the solid heat transfer layer and the cooler.

8. The semiconductor device of claim 1, wherein
   a non-solid heat transfer material is filled between the package and the cooler so that the non-solid heat transfer material surrounds the solid heat transfer layer in a plan view of the one surface of the package.

9. The semiconductor device of claim 8, wherein the non-solid heat transfer material is filled between the solid heat transfer layer and the cooler.

10. A manufacturing method of the semiconductor device of claim 1, the method comprising:
    forming the package so as to cover the thermal conductive surface of the heat sink with the resin;
    grinding a portion of the resin which covers the thermal conductive surface so as to expose the thermal conductive surface, the recessed region being formed at the thermal conductive surface by the grinding;
    applying a pre-solidified heat transfer material to the recessed region and planarizing a surface of the pre-solidified heat transfer material while holding the pre-solidified heat transfer material with a holder so as not to spread out the pre-solidified heat transfer material to the resin surface;
    solidifying the pre-solidified heat transfer material; and
    fixing the cooler and the semiconductor module with the cooler being pressed against the thermal conductive surface of the semiconductor module.

* * * * *